(12) United States Patent
Murata

(10) Patent No.: US 10,024,945 B2
(45) Date of Patent: Jul. 17, 2018

(54) ABNORMALITY DIAGNOSIS APPARATUS THAT DETERMINES AN ABNORMALITY OF A POWER-SUPPLY VOLTAGE SENSOR

(71) Applicant: DENSO CORPORATION, Kariya, Aichi-pref. (JP)

(72) Inventor: Yuri Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 76 days.

(21) Appl. No.: 15/348,653

(22) Filed: Nov. 10, 2016

(65) Prior Publication Data
US 2017/0131378 A1    May 11, 2017

(30) Foreign Application Priority Data

Nov. 10, 2015 (JP) .................................. 2015-220268

(51) Int. Cl.
*G01R 35/00* (2006.01)
*B60L 11/18* (2006.01)
*G01R 19/25* (2006.01)

(52) U.S. Cl.
CPC .......... *G01R 35/00* (2013.01); *B60L 11/1851* (2013.01); *G01R 19/2513* (2013.01)

(58) Field of Classification Search
None
See application file for complete search history.

(56) References Cited

U.S. PATENT DOCUMENTS

| 7,173,397 B2* | 2/2007 | Kinoshita | B60L 11/1851 320/134 |
| 7,432,719 B2* | 10/2008 | Nozaki | B60L 3/0046 324/429 |
| 7,781,999 B2* | 8/2010 | Amano | B60L 11/14 307/9.1 |
| 8,018,702 B2* | 9/2011 | Maeda | B60R 16/03 361/92 |

(Continued)

FOREIGN PATENT DOCUMENTS

| JP | 4793058 B2 | 10/2011 |
| JP | 2015-091144 A | 5/2015 |
| JP | 2017-093150 A | 5/2017 |

*Primary Examiner* — Jermele M Hollington
*Assistant Examiner* — Douglas X Rodriguez
(74) *Attorney, Agent, or Firm* — Oliff PLC

(57) ABSTRACT

An abnormality diagnosis apparatus includes a power consumption estimation section that estimates power consumption of a motor, which is driven by power supplied from a power supply, and power consumption of an auxiliary unit using the power to calculate a power consumption estimate value, a power-supply voltage estimation section that calculates a power-supply voltage estimate value, which is an estimate value of voltage of the power supply, based on the power consumption estimate value and a power-supply current detection value, which is based on a detection value of a power-supply current sensor detecting a current of the power supply, and an abnormality determination section that determines an abnormality of a power-supply voltage sensor detecting a voltage of the power supply, based on a com- (Continued)

parison result between the power-supply voltage estimate value and a power-supply voltage detection value, which is based on a detection value of the power-supply voltage sensor.

5 Claims, 8 Drawing Sheets

(56) References Cited

U.S. PATENT DOCUMENTS

| | | | |
|---|---|---|---|
| 2007/0223259 A1* | 9/2007 | Nozaki | B60K 6/485 363/50 |
| 2014/0240872 A1* | 8/2014 | Nomura | H02M 3/156 361/18 |
| 2017/0131379 A1 | 5/2017 | Omata et al. | |

* cited by examiner

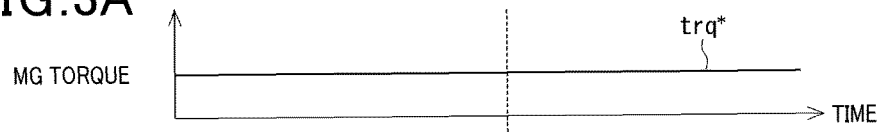
FIG.3A MG TORQUE — trq*
FIG.3B MG ROTATION NUMBER — N*
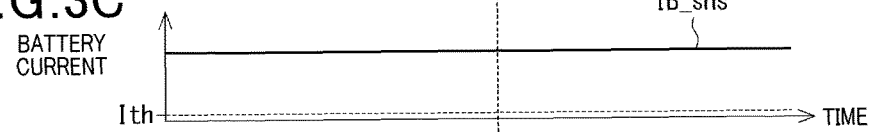
FIG.3C BATTERY CURRENT — IB_sns, Ith
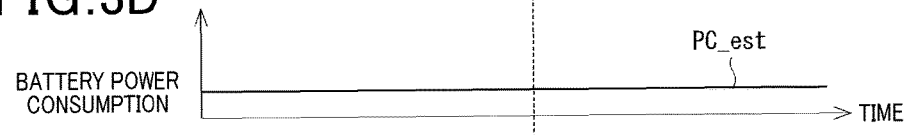
FIG.3D BATTERY POWER CONSUMPTION — PC_est
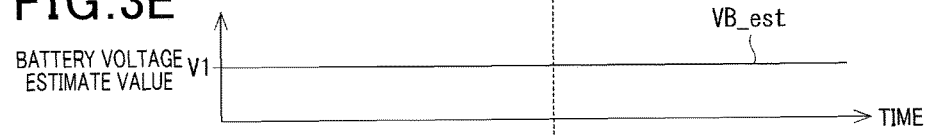
FIG.3E BATTERY VOLTAGE ESTIMATE VALUE — VB_est, V1
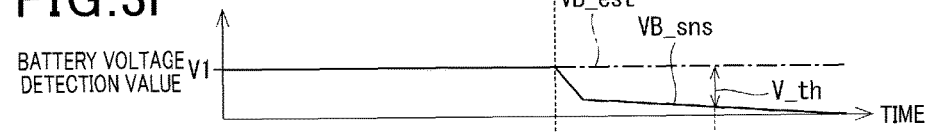
FIG.3F BATTERY VOLTAGE DETECTION VALUE — VB_est, VB_sns, V_th, V1
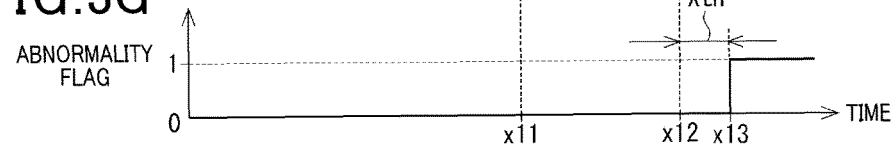
FIG.3G ABNORMALITY FLAG — Xth, x11, x12, x13

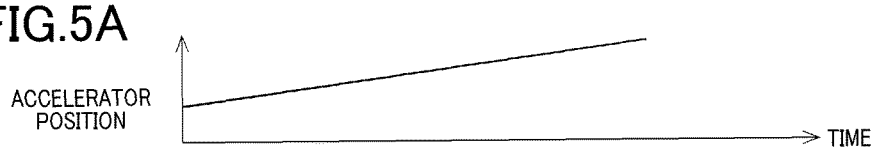
FIG.5A ACCELERATOR POSITION
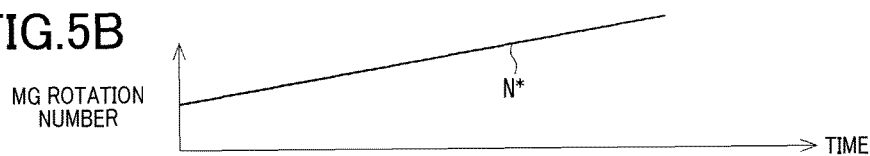
FIG.5B MG ROTATION NUMBER
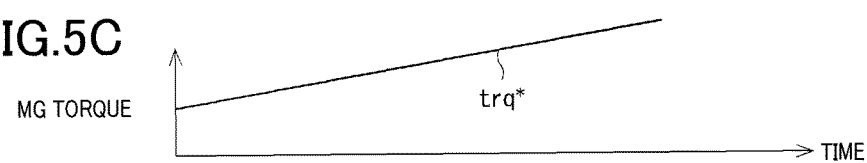
FIG.5C MG TORQUE
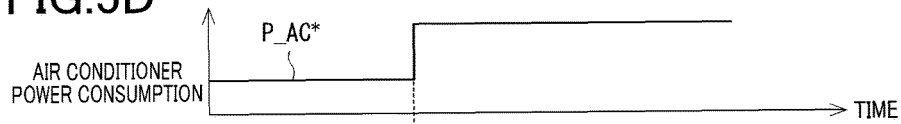
FIG.5D AIR CONDITIONER POWER CONSUMPTION
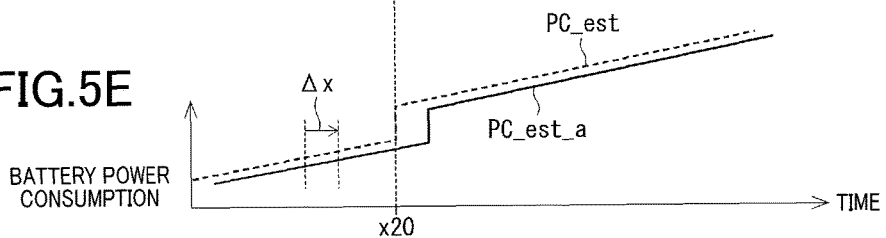
FIG.5E BATTERY POWER CONSUMPTION

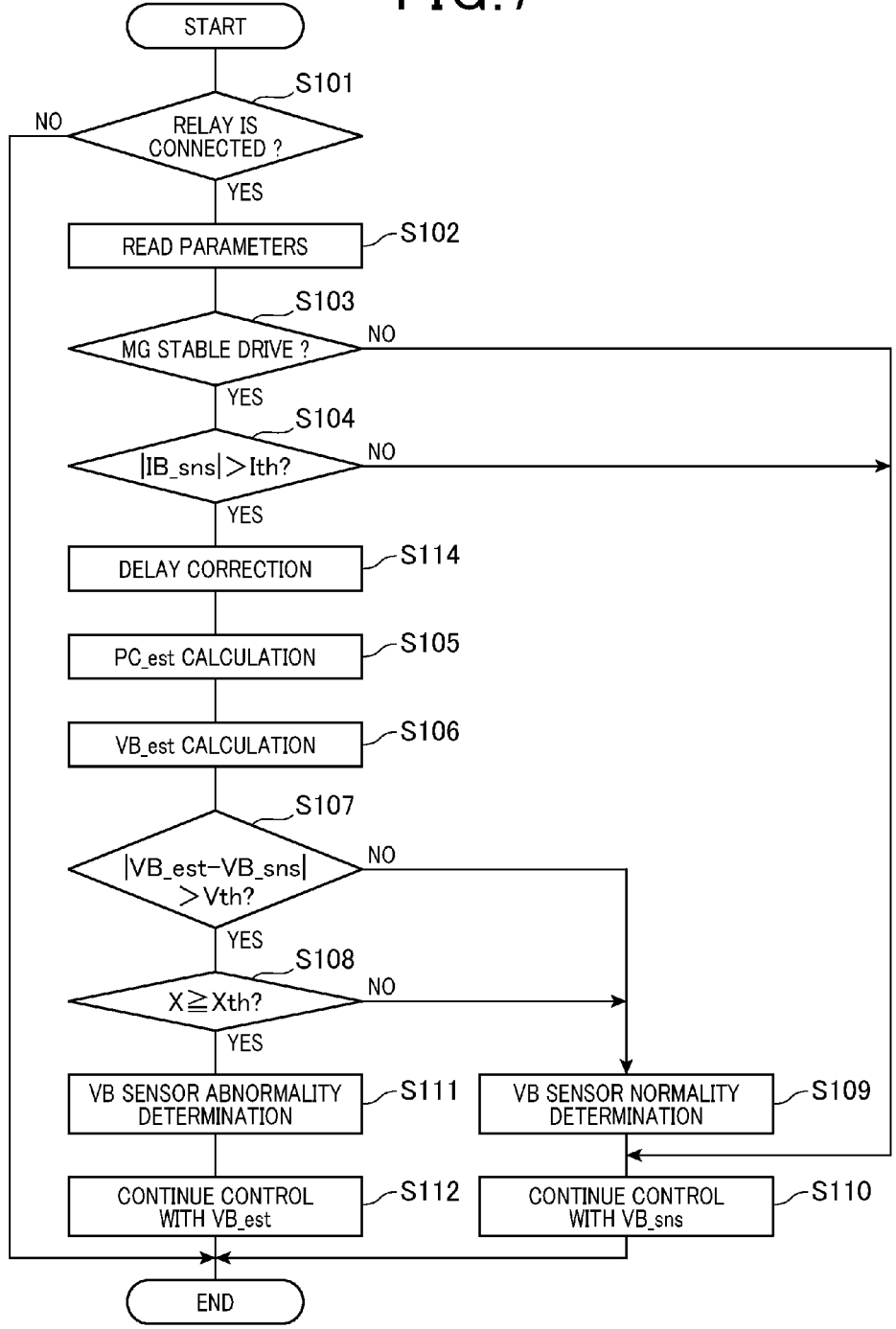

US 10,024,945 B2

ABNORMALITY DIAGNOSIS APPARATUS THAT DETERMINES AN ABNORMALITY OF A POWER-SUPPLY VOLTAGE SENSOR

CROSS-REFERENCE TO RELATED APPLICATION

This application is based on and claims the benefit of priority from earlier Japanese Patent Application No. 2015-220268 filed Nov. 10, 2015, the description of which is incorporated herein by reference.

BACKGROUND

Technical Field

The present invention relates to an abnormality diagnosis apparatus.

Related Art

Conventionally, a fault diagnosis apparatus for a voltage sensor has been known, the apparatus performing a fault diagnosis of the voltage sensor. For example, according to Japanese Patent No. 4793058, when the difference between a battery voltage and an inverter voltage is more than a predetermined value a, an output of an AC motor is calculated based on a voltage command value and a current detection value of an inverter, and an output of the AC motor is calculated based on a torque command value and a motor rotation speed. Then, if the absolute value of the difference between the outputs is a predetermined value PO or less, it is determined that a fault has occurred in a battery voltage sensor.

According to Japanese Patent No. 4793058, although a fault of the voltage sensor is specified by comparing powers with each other, a battery voltage cannot be directly estimated from the power calculated for detecting a fault, theoretically. In addition, since a detection threshold value is required to be changed depending on the absolute value of the voltage, it is difficult to ensure detection accuracy especially for devices having a wide voltage range to be used.

SUMMARY

An embodiment provides an abnormality diagnosis apparatus that can appropriately determine an abnormality of a power-supply voltage sensor.

As an aspect of the embodiment, an abnormality diagnosis apparatus includes: a power consumption estimation section that estimates power consumption of a traction unit motor, which is a driving source of a vehicle and is driven by electric power supplied from an electric power supply, and power consumption of an auxiliary unit using the electric power of the electric power supply to calculate a power consumption estimate value; a power-supply voltage estimation section that calculates a power-supply voltage estimate value, which is an estimate value of voltage of the electric power supply, based on the power consumption estimate value and a power-supply current detection value, which is a value based on a detection value of a power-supply current sensor detecting a current of the electric power supply; and an abnormality determination section that determines an abnormality of a power-supply voltage sensor detecting a voltage of the electric power supply, based on a comparison result between the power-supply voltage estimate value and a power-supply voltage detection value, which is a value based on a detection value of the power-supply voltage sensor.

BRIEF DESCRIPTION OF THE DRAWINGS

In the accompanying drawings:

FIGS. 3A to 3G are timing diagrams illustrating the abnormality determination process according to the first embodiment;

FIGS. 5A to 5E are timing diagrams illustrating delay correction according to the second embodiment;

FIG. 7 is a flowchart illustrating an abnormality determination process according to a third embodiment.

DETAILED DESCRIPTION OF THE PREFERRED EMBODIMENTS

Figure 1:
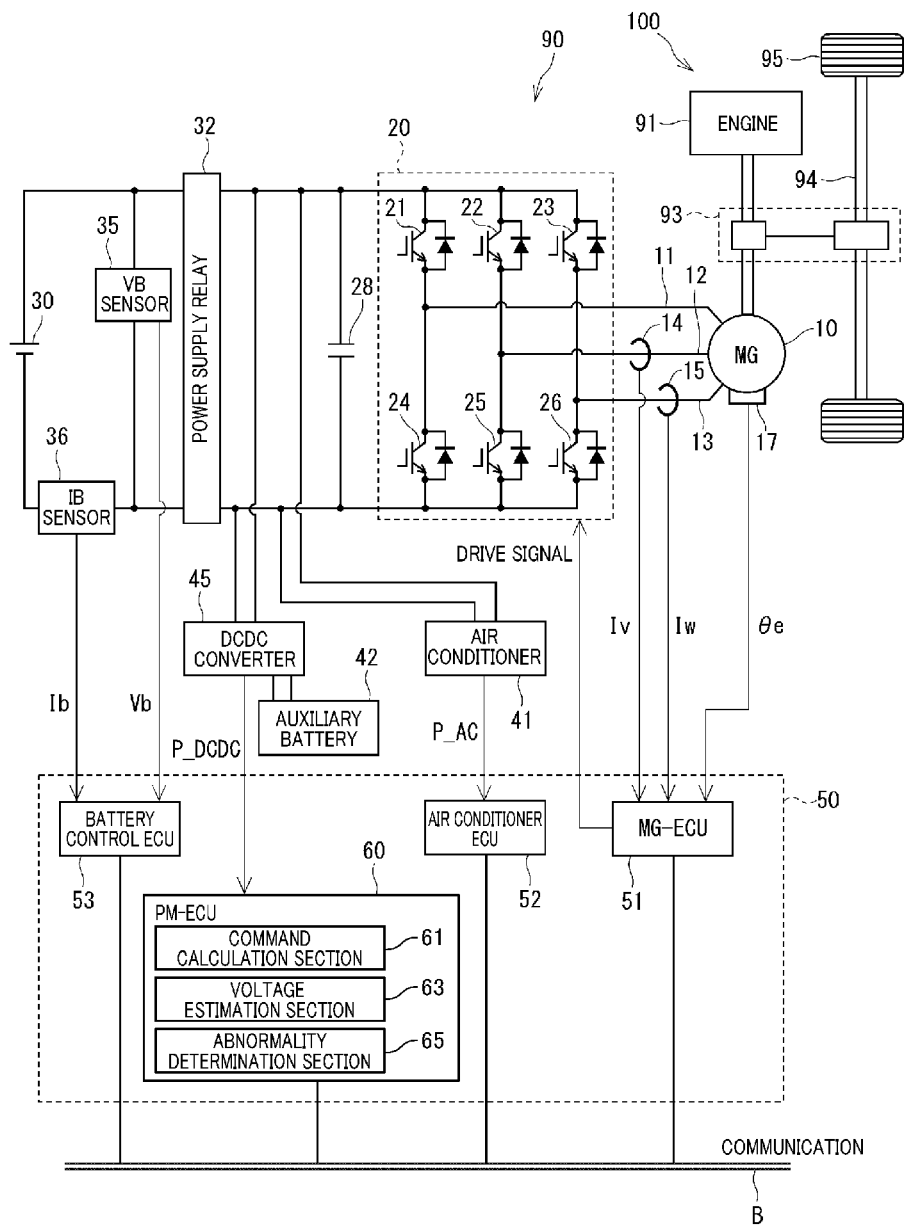
FIG. 1 is a schematic diagram showing a configuration of a vehicle control system according to a first embodiment.

Hereinafter, embodiments are described with reference to the drawings. The substantially same components are denoted by the same reference numerals for omitting redundant descriptions.

First Embodiment

The first embodiment will be described with reference to FIG. 1 to FIG. 3G.

As shown in FIG. 1, an abnormality diagnosis apparatus of the present embodiment is applied to a vehicle control system 90 that controls the overall operation of a vehicle 100. The vehicle control system 90 includes an engine 91, a traction unit motor 10, an inverter 20, a battery 30, and a control unit 50.

The vehicle 100 is a so-called hybrid vehicle including the engine 91 and the traction unit motor 10 as driving sources. Driving forces of the traction unit motor 10 and the engine 91 are transferred to an axle shaft 94 via a gear 93 and the like to drive driving wheels 95. The drive of the engine 91 is controlled by an engine ECU, not shown.

The traction unit motor 10 is, for example, a permanent magnet synchronous type three-phase AC rotary machine. The traction unit motor 10 is a so-called motor generator having a function as an electric motor, which is driven by electric power supplied from the battery 30 serving as an electric power supply to generate torque, and a generator, which is driven by torque transmitted from the engine 91 or the drive driving wheels 95 to generate electric power.

Hereinafter, a case will be mainly described where the traction unit motor 10 functions as an electric motor.

The traction unit motor 10 has a U-phase coil 11, a V-phase coil 12, and a W-phase coil 13. Current sensors 14 and 15 detect currents of any two phases of the three phases. In the present embodiment, the current sensor 14 detects a V-phase current Iv, which is a current of the V-phase coil 12. The current sensor 15 detects a W-phase current Iw, which is a current of the W-phase coil 13. The detection values of the current sensors 14 and 15 are output to a MG-ECU 51.

In addition, the traction unit motor 10 is provided with a rotation angle sensor 17, which detects an electric angle θ of the rotor of the traction unit motor 10. The rotation angle sensor 17 is, for example, a resolver. Detection values of the rotation angle sensor 17 are output to the MG-ECU 51.

The inverter 20 is provided between the battery 30 and the traction unit motor 10 and has six switching elements 21 to 26. Although the switching elements 21 to 26 are IGBTs, the switching elements 21 to 26 may be MOSFETs, thyristors, or the like. Each of the switching elements 21 to 26 is connected in parallel with a freewheel diode that allows a current flow from the low potential side to the high potential side.

The switching elements 21 to 26 are bridge-connected with each other, and are controlled so as to be turned on and off based on a drive signal output from the MG-ECU 51. Thereby, DC power of the battery 30 is converted to AC power, which is supplied to the traction unit motor 10. In addition, AC power generated by the traction unit motor 10 is converted to DC power, which is supplied to the battery 30.

A smoothing capacitor 28 is connected in parallel with the inverter 20, and smoothes an inverter input voltage Vinv, which is a voltage input to the inverter 20.

The battery 30 is a chargeable and dischargeable secondary battery such as a nickel hydride battery and a lithium-ion battery. In addition, instead of the battery 30, an electric double layer capacitor or the like may be used as an electric power supply.

A power supply relay 32 is provided between both the inverter 20 and the smoothing capacitor 28 and the battery 30 and can interrupt power supply between the inverter 20 side and the battery 30 side. Hereinafter, with respect to the power supply relay 32, the battery 30 side is defined as an upstream side, and the opposite side of the battery 30 is defined as a downstream side.

A battery voltage sensor 35 is provided so that the distance between the battery voltage sensor 35 and the battery 30 is shorter than the distance between the power supply relay 32 and the battery 30. The battery voltage sensor 35 detects a battery voltage VB, which is a voltage of the battery 30.

A battery current sensor 36 is provided so that the distance between the battery voltage sensor 36 and the battery 30 is shorter than the distance between the power supply relay 32 and the battery 30. The battery current sensor 36 detects a battery current IB, which is a current of the battery 30.

The detection value of the battery voltage sensor 35 and the detection value of the battery current sensor 36 are output to a battery control ECU 53. In FIG. 1, the battery voltage sensor is represented as "VB sensor", and the battery current sensor is represented as "IB sensor".

The electric power of the battery 30 is also supplied to, in addition to the traction unit motor 10, an air conditioner 41 and an auxiliary battery 42. In the present embodiment, the air conditioner 41 and the auxiliary battery 42 correspond to auxiliary units.

The air conditioner 41 is supplied with electric power of the battery 30 from the downstream side of the power supply relay 32. Air conditioner power consumption P_AC, which is power consumption in the air conditioner 41, is output to an air conditioner ECU 52.

The auxiliary battery 42 supplies electric power to various auxiliary units used in the vehicle 100, and is supplied with electric power via a DCDC converter 45. The DCDC converter 45 is connected to the downstream side of the power supply relay 32, and converts the voltage of the battery 30 to a voltage which can be supplied to the auxiliary battery 42. DCDC power consumption P_DCDC, which is power consumption in the DCDC converter 45, is outputted to a power management ECU (hereinafter, referred to as "PM-ECU") 60.

The control unit 50 includes the MG-ECU 51, the air conditioner ECU 52, the battery control ECU 53, the PM-ECU 60, and the engine ECU, not shown. Each of the ECUs is mainly configured by a microcomputer and the like. Processes performed by the control unit 50 may be software processes performed in such a manner that a CPU executes a program previously stored in a substantive memory such as a ROM, or may be hardware processes performed by a dedicated electronic circuit.

The MG-ECU 51, the air conditioner ECU 52, the battery control ECU 53, the PM-ECU 60, and the engine ECU can transmit information to and receive information from each other by CAN (Controller Area Network) communication or the like via a bus line B.

The MG-ECU 51 controls drive of the traction unit motor 10. Specifically, the MG-ECU 51 generates a drive signal for controlling on-off operation of the switching elements 21 to 26 by PWM control or the like based on phase currents Iv and Iw, electric angle θ, and the like. The generated drive signal is output to the switching elements 21 to 26 via a drive circuit and the like, not shown. By controlling on-off (switching) operation of the switching elements 21 to 26, the drive of the traction unit motor 10 is controlled.

The air conditioner ECU 52 controls drive of the air conditioner 41.

The battery control ECU 53 obtains the battery voltage VB and the battery current IB, and monitors the battery 30 so that SOC (State Of Charge) of the battery 30 falls within a predetermined range.

The PM-ECU 60 manages supply of electric power to various types of equipment mounted in the vehicle 100. The PM-ECU 60 obtains the air conditioner power consumption P_AC, the DCDC power consumption P_DCDC, the detection value of the battery voltage sensor 35, the detection value of the battery voltage sensor 36, an accelerator position, brake pedal force, vehicle speed, and the like. These values obtained by the PM-ECU 60 may be directly obtained from sensors, devices, and the like, or may be obtained from another ECU by using communication.

The PM-ECU 60 has a command calculation section 61, a voltage estimation section 63, and an abnormality determination section 65, as function blocks.

The command calculation section 61 calculates a torque command value trq* and a rotation number command value N* as command values for drive control of the traction unit motor 10, based on the accelerator position, the brake pedal force, the vehicle speed, and the like. The torque command value trq* and the rotation number command value N* are output to the MG-ECU 51 by communication.

The voltage estimation section 63 estimates a power consumption estimate value PC_est of the battery 30 used for estimating the battery voltage VB. The power consumption estimate value PC_est is expressed by expression (1). In expression (1), P_mg is power consumption of the traction unit motor 10, and P_acc is power consumption of the auxiliary unit. In the present embodiment, the auxiliary unit power consumption P_acc includes the air conditioner power consumption P_AC and the DCDC power consumption P_DCDC. For example, if another auxiliary unit such as an electric power steering unit is present which uses electric power from the battery 30, the power consumption thereof is appropriately added to the auxiliary unit power consumption P_acc. In addition, in expression (1), P_loss is power loss. For P_loss, a predetermined value is previously set.

$$PC\_est = P\_mg + P\_acc + P\_loss \quad (1)$$
$$= trq^* \times N^* + (P\_AC + P\_DCDC) + P\_loss$$

The voltage estimation section 63 calculates a battery voltage estimate value VB_est based on the power consumption estimate value PC_est and a battery current detection value IB_sns. The battery current detection value IB_sns is a value based on the detection value of the battery current sensor 36. The battery voltage estimate value VB_est is expressed by expression (2). Note that abnormality determination for the battery current sensor 36 and the like is assumed to be performed separately. It is assumed that parameters used for calculating the battery voltage estimate value VB_est are in normal conditions.

$$VB\_est = PC\_est / IB\_sns \quad (2)$$

The abnormality determination section 65 determines an abnormality of the battery voltage sensor 35 by comparing a battery voltage detection value VB_sns with the battery voltage estimate value VB_est. The battery voltage detection value VB_sns is a value based on the detection value of the battery voltage sensor 35.

Hereinafter, an abnormality determination process for the battery voltage sensor 35 will be described based on the flowchart of FIG. 2. The process is performed by the PM-ECU 60 at predetermined intervals.

First, in step S101, the PM-ECU 60 determines whether or not the power supply relay 32 is connected. Hereinafter, step S101 is simply indicated by S101. Other steps are indicated similarly. If the PM-ECU 60 determines that the power supply relay 32 is not connected (S101: NO), the PM-ECU 60 does not perform S102 and the subsequent steps. If the PM-ECU 60 determines that the power supply relay 32 is connected (S101: NO), the present process proceeds to S102.

In S102, the PM-ECU 60 reads parameters used in the subsequent steps.

In S103, the abnormality determination section 65 determines whether or not the traction unit motor 10 is in a stable drive state. In the present embodiment, when change rates of MG torque trq and the MG rotation number N are less than determination threshold values, a stable drive state is assumed. Note that the MG torque trq and the MG rotation number N may be command values, detection values, or estimate values. Instead of the MG torque trq and the MG rotation number N, when a change rate of an accelerator position is within a predetermined range, the traction unit motor 10 may be assumed to be in a stable drive state. If it is determined that the traction unit motor 10 is not in a stable drive state (S103: NO), the abnormality determination section 65 does not perform abnormality determination for the battery voltage sensor 35, and the present process proceeds to S110. If it is determined that the traction unit motor 10 is in a stable drive state (S103: YES), the present process proceeds to S104.

In S104, the abnormality determination section 65 determines whether or not the absolute value of the battery current detection value IB_sns is more than a current determination threshold value Ith. If it is determined that the absolute value of the battery current detection value IB_sns is the current determination threshold value Ith or less (S104: NO), the abnormality determination section 65 does not perform abnormality determination for the battery voltage sensor 35, and the present process proceeds to S110. If the battery current detection value IB_sns is close to 0, expression (2) is solved almost in a state of using 0 as the divisor (denominator), so-called division by zero. Thereby, a calculation error of the battery voltage estimate value VB_est becomes large. Hence, if the battery current detection value IB_sns is the current determination threshold value Ith or less, abnormality determination for the battery voltage sensor 35 is prohibited. Note that as the required detection accuracy of the battery voltage sensor 35 increases, the current determination threshold value Ith is set to be larger. If it is determined that the absolute value of the battery current detection value IB_sns is more than the current determination threshold value Ith (S104: YES), the present process proceeds to S105.

In S105, the voltage estimation section 63 calculates power consumption estimate value PC_est (refer to equation (1)).

In S106, the voltage estimation section 63 calculates the battery voltage estimate value VB_est (refer to equation (2)).

In S107, the abnormality determination section 65 determines whether or not the absolute value of the difference between the battery voltage estimate value VB_est and the battery voltage detection value VB_sns is more than a voltage determination threshold value Vth. If it is determined that the absolute value of the difference between the battery voltage estimate value VB_est and the battery voltage detection value VB_sns is the voltage determination threshold value Vth or less (S107: NO), the present process proceeds to S109. Note that if a duration X described later is not 0, the duration X is reset. If it is determined that the absolute value of the difference between the battery voltage estimate value VB_est and the battery voltage detection value VB_sns is more than the voltage determination threshold value Vth (S107: YES), the abnormality determination section 65 starts measuring the duration X from the time when it is determined that the absolute value of the difference between the battery voltage estimate value VB_est and the battery voltage detection value VB_sns is more than the voltage determination threshold value Vth. Then, the present process proceeds to S108. If the measurement of the duration X has been started, the measurement is continued.

In S108, the abnormality determination section 65 determines whether or not the duration X is a determination time period Xth or more. If it is determined that the duration X is less than the determination time period Xth (S108: NO), the present process proceeds to S109. If it is determined that the duration X is the determination time Xth or more (S108: YES), the present process proceeds to S111.

In S109, to which the present process proceeds if the absolute value of the difference between the battery voltage estimate value VB_est and the battery voltage detection value VB_sns is the voltage determination threshold value Vth or less (S107: NO) or if the duration X is less than the determination time period Xth (S108: NO), the abnormality determination section 65 determines that the battery voltage sensor 35 is normal.

In S110, to which the present process proceeds if negative determination is made in S103 or S104, or to which the present process proceeds immediately after S109, the PM-ECU 60 continues the control using the battery voltage detection value VB_sns. Specifically, for example, the command calculation section 61 uses the battery voltage detection value VB_sns to calculate the torque command value trq* and the rotation number command value N*.

In S111, to which the present process proceeds if the state where the absolute value of the difference between the battery voltage estimate value VB_est and the battery voltage detection value VB_sns is more than the voltage determination threshold value Vth has continued for the determination time period Xth or more (S107: YES, and S108: YES), the abnormality determination section 65 determines that the battery voltage sensor 35 is abnormal, and sets an abnormality flag.

In S112, the PM-ECU 60 uses the battery voltage estimate value VB_est to continue the control. Specifically, for example, the command calculation section 61 uses the battery voltage estimate value VB_est to calculate the torque command value trq* and the rotation number command value N*. That is, if it is determined that the battery voltage sensor 35 is abnormal, the PM-ECU 60 uses the battery voltage estimate value VB_est as a fail-safe value to calculate the torque command value trq* and the like, whereby the vehicle 100 can continue to run. Note that when the control is continued by using the battery voltage estimate value VB_est in the state where the battery voltage sensor 35 is determined to be abnormal, the control may be similar to that performed when the battery voltage sensor 35 is normal, or may be different from that performed when the battery voltage sensor 35 is normal (e.g. backup control). For example, in the different control, torque may be limited.

FIGS. 3A to 3G show timing diagrams illustrating the abnormality determination process. In FIGS. 3A to 3G, the horizontal axis is a common temporal axis. FIG. 3A shows MG torque. FIG. 3B shows the MG rotation number. FIG. 3C shows battery current. FIG. 3D shows battery power consumption. FIG. 3E shows a battery voltage estimate value. FIG. 3F shows a battery voltage detection value. FIG. 3G shows an abnormality flag. In FIG. 3F, the battery voltage estimate value VB_est is shown by an alternate long and short dash line. In FIG. 3G, the state where the abnormality flag is set is shown by "1", and the state where the abnormality flag is not set is shown by "0". In addition, in examples shown in FIG. 3A to 3G, the auxiliary unit power consumption P_acc is assumed to be constant.

As shown in FIGS. 3A and 3B, when the torque command value trq* and the rotation number command value N* are constant, and the traction unit motor 10 is driven constantly, as shown in FIGS. 3C and 3D, the battery current detection value IB_sns and the power consumption estimate value PC_est become substantially constant. In addition, as shown in FIG. 3E, the battery voltage estimate value VB_est calculated based on the battery current detection value IB_sns and the power consumption estimate value PC_est also become substantially constant.

In addition, as shown in FIGS. 3E and 3F, in the time period until time x11 at which an abnormality occurs in the battery voltage sensor 35, the battery voltage estimate value VB_est and the battery voltage detection value VB_sns both become a value V1 and substantially agree with each other.

At the time x11, if an abnormality occurs in the battery voltage sensor 35, the battery voltage estimate value VB_est and the battery voltage detection value VB_sns become different from each other. In the present embodiment, at time x12, the absolute value of the difference between the battery voltage estimate value VB_est and the battery voltage detection value VB_sns becomes more than the voltage determination threshold value Vth. After time x12, the state continues where the absolute value of the difference between the battery voltage estimate value VB_est and the battery voltage detection value VB_sns is more than the voltage determination threshold value Vth. At time x13 until which the state where the absolute value of the difference between the battery voltage estimate value VB_est and the battery voltage detection value VB_sns is more than the voltage determination threshold value Vth has continued for the determination time period Xth, the abnormality determination section 65 determines that an abnormality has occurred in the battery voltage sensor 35, and sets an abnormality flag.

In the present embodiment, an abnormality of the battery voltage sensor 35 is detected by comparing the battery voltage estimate value VB_est with the battery voltage detection value VB_sns. For example, when powers are compared with each other, it is difficult to ensure detection accuracy when a voltage range to be used is wide, because, for example, a detection threshold value is required to be changed depending on the absolute value of the voltage.

Meanwhile, in the present embodiment, since the voltage values are compared with each other, if the battery voltage sensor 35 is normal, the difference between the battery voltage estimate value VB_est and the battery voltage detection value VB_sns becomes substantially 0. Hence, the voltage determination threshold value Vth may be set to, for example, a value close to 0 depending on specifications of the sensor or the like. Thus, the voltage determination threshold value Vth can be set easily, and may be a fixed value without depending on the absolute value of the voltage. In addition, in a wide voltage range, the accuracy in detecting abnormality of the battery voltage sensor 35 can be ensured.

In addition, the battery voltage estimate value VB_est is calculated based on the torque command value trq* and the rotation number command value N* of the traction unit motor 10, the air conditioner power consumption P_AC and the DCDC power consumption P_DCDC, which are the auxiliary unit power consumption, and the battery current detection value IB_sns. That is, since the inverter input voltage Vinv is not used for calculating the battery voltage estimate value VB_est, the PM-ECU 60 is not required to obtain a signal from an inverter input voltage sensor, not shown.

Hereinbefore, the case has been described where the driving state of the traction unit motor 10 is powering. When the driving state of the traction unit motor 10 is regeneration, MG power consumption P_mg becomes a negative value, whereby the calculations and the abnormality determination can be performed as in the case of powering.

As described above, the PM-ECU 60 includes the voltage estimation section 63 and the abnormality determination section 65.

The voltage estimation section 63 estimates the MG power consumption P_mg, which is power consumption of the traction unit motor 10, and the auxiliary unit power consumption P_acc, which includes power consumption of the air conditioner 41 using electric power of the battery 30 and the auxiliary battery 42, to calculate the power consumption estimate value PC_est. The traction unit motor 10 is a drive source of the vehicle 100, and is driven by electric power supplied from the battery 30.

The voltage estimation section 63 calculates the battery voltage estimate value VB_est, which is an estimate value of the voltage of the battery 30, based on the power consumption estimate value PC_est and the battery current detection value IB_sns, which is a value based on the detection value of the battery current sensor 36 detecting a current of the battery 30. Specifically, a value obtained by dividing the power consumption estimate value PC_est by the battery current detection value IB_sns is defined as the battery voltage estimate value VB_est.

The abnormality determination section 65 determines an abnormality of the battery voltage sensor 35 based on the result of comparison between the battery voltage estimate value VB_est and the battery voltage detection value VB_sns, which is a value based on the detection value of the battery voltage sensor 35 detecting a voltage of the battery 30.

In the present embodiment, an abnormality of the battery voltage sensor 35 can be appropriately determined by calculating the battery voltage estimate value VB_est and directly comparing the battery voltage estimate value VB_est with the battery voltage detection value VB_sns. In addition, since an abnormality is determined by comparing the voltage values with each other, the voltage determination threshold value Vth regarding the abnormality determination can be easily determined depending on specifications of the sensor or the like.

If it is determined that the battery voltage sensor 35 is abnormal, the control can be continued by using the battery voltage estimate value VB_est used for the abnormality determination. Hence, the vehicle 100 can continuously run without additional calculation.

In addition, when the traction unit motor 10 is in a stable drive state, the abnormality determination section 65 performs abnormality determination for the battery voltage sensor 35. That is, when the traction unit motor 10 is not in a stable drive state, the abnormality determination for the battery voltage sensor 35 is inhibited. Hence, erroneous determination can be prevented that an abnormality has occurred in the battery voltage sensor 35 by variation in the battery voltage estimate value VB_est due to unstable drive of the traction unit motor 10.

In the present embodiment, the PM-ECU 60 corresponds to an abnormality diagnosis apparatus, the voltage estimation section 63 corresponds to a power consumption estimation section and a power-supply voltage estimation section. In addition, the battery voltage sensor 35 corresponds to a power-supply voltage sensor, and the battery current sensor 36 corresponds to a power-supply current sensor. Furthermore, the battery voltage detection value VB_sns corresponds to a power-supply voltage detection value, the battery voltage estimate value VB_est corresponds to a power-supply voltage estimate value, and the battery current detection value IB_sns corresponds to a power-supply current detection value.

Second Embodiment

The second embodiment will be described with reference to FIG. 4 to FIG. 6.

The second embodiment and the third embodiment differ from the first embodiment in that communication delay is considered in the battery voltage estimate value VB_est used for the abnormality determination.

In the present embodiment, for simplicity, the DCDC power consumption P_DCDC is omitted, and the power consumption of the air conditioner 41 is defined as the auxiliary unit power consumption P_acc. In calculation of the power consumption estimate value PC_est, an air conditioner electric power command value P_AC* is used as the power consumption of the air conditioner 41. The air conditioner electric power command value P_AC* is calculated by the PM-ECU 60 and is output to the air conditioner ECU 52. Similarly, the third embodiment is configured.

Figure 2:
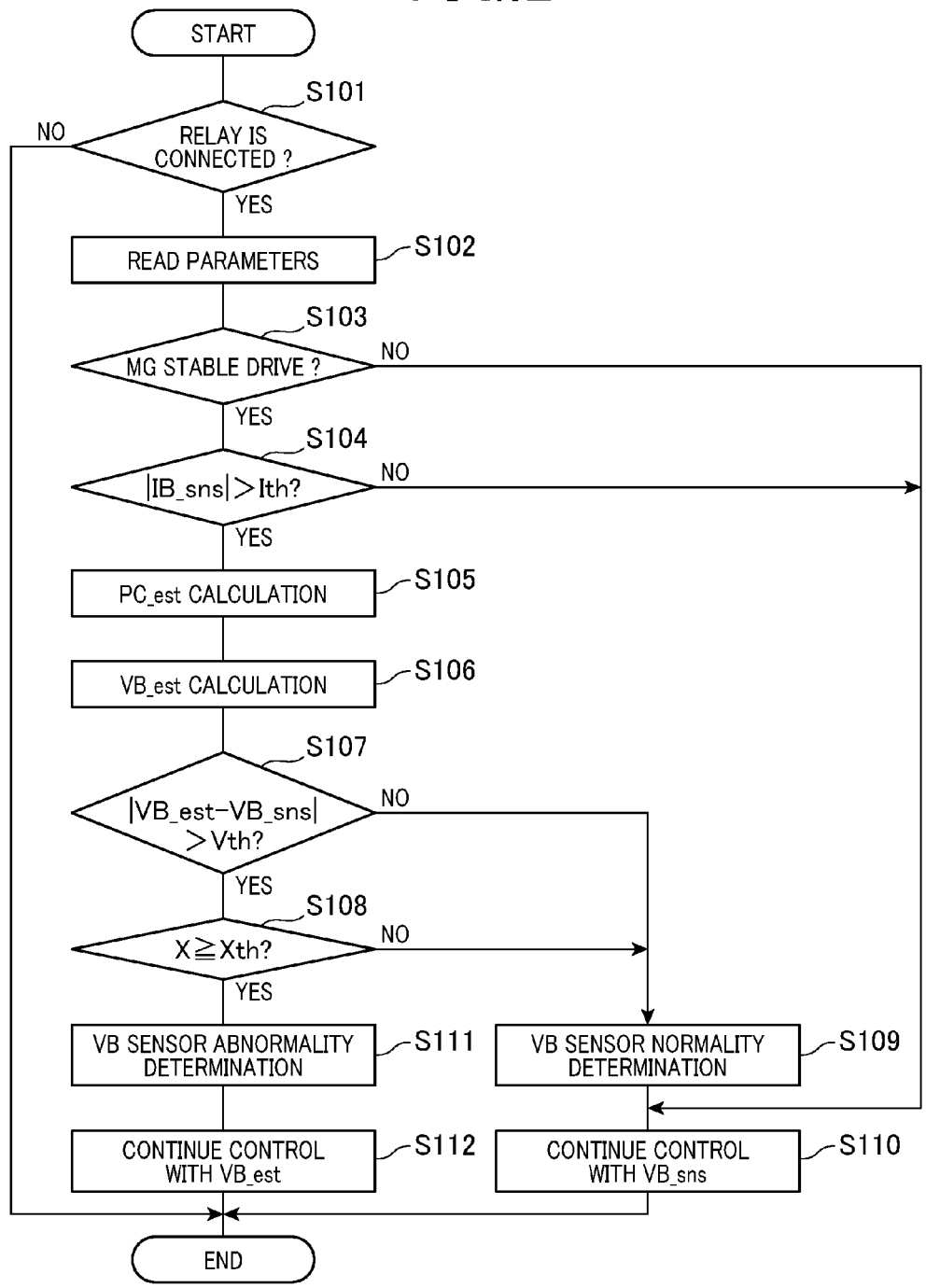
FIG. 2 is a flowchart illustrating an abnormality determination process according to the first embodiment.
Figure 4:
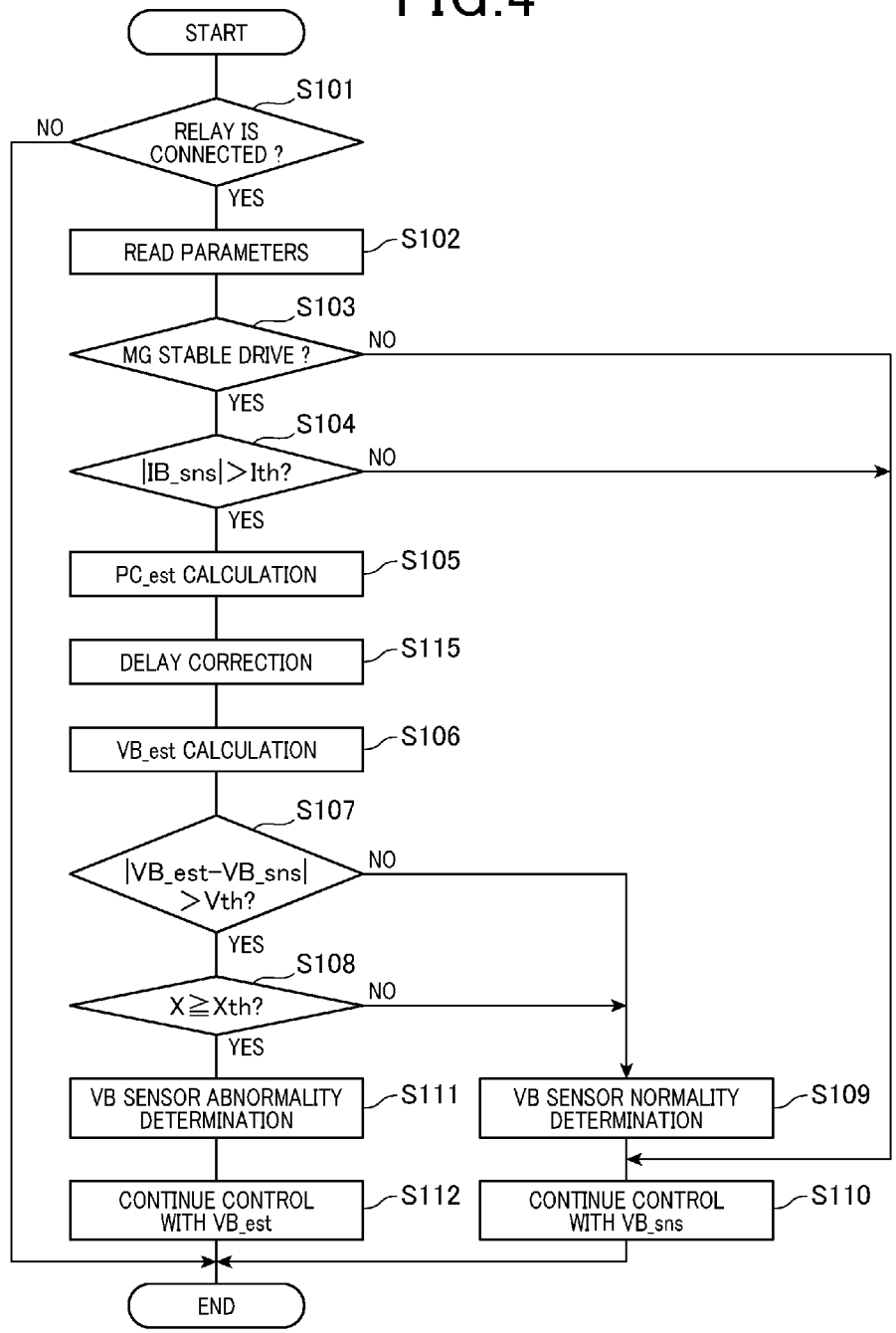
FIG. 4 is a flowchart illustrating an abnormality determination process according to a second embodiment.

As shown in FIG. 4, in the abnormality determination process of the present embodiment, S115 is added between S105 and S106 of FIG. 2. In addition, in the present embodiment, past power consumption estimate values PC_est (past values) during at least a time period corresponding to communication delay are held in a storage unit, not shown. Other configurations are similar to those of the first embodiment.

In S115, the abnormality determination section 65 performs delay correction of the power consumption estimate value PC_est. Specifically, a past value corresponding to a power consumption delay time $\Delta x$ is defined as a post-correction power consumption estimate value PC_est_a used for calculating a current battery voltage estimate value VB_est. The power consumption delay time $\Delta x$ is set to the order of about, for example, 10 [ms], and is set to be longer than the control period (e.g. several µs) of the traction unit motor 10. In the present embodiment, although the power consumption delay time $\Delta x$ is a predetermined value corresponding to a communication period, the power consumption delay time $\Delta x$ may be variable.

In the present embodiment, the PM-ECU 60 and the MG-ECU 51 controlling the drive of the traction unit motor 10 are configured by different ECUs. In addition, the torque command value trq* and the rotation number command value N* generated by the PM-ECU 60 are transmitted to the MG-ECU 51 by communication using CAN or the like. Hence, the timing when electric power corresponding to the command is consumed by the traction unit motor 10 is delayed from the timing when the command is generated by the PM-ECU 60. The delay width depends on the communication period between the PM-ECU 60 and the MG-ECU 51 and becomes substantially constant according to the system configuration. Similarly, the power consumption of the air conditioner 41 is treated.

Thus, in the present embodiment, the power consumption estimate value PC_est is corrected depending on the predetermined power consumption delay time $\Delta x$.

By adding (x) to each parameter at a given time x, expression (1) to expression (3) are rewritten. In addition, the post-correction power consumption estimate value PC_est_a, which is a value obtained by correcting the power consumption estimate value PC_est depending on the power consumption delay time $\Delta x$ is expressed by expression (4).

$$PC\_est(x) = trq^*(x) \times N^*(x) + P\_AC^*(x) + P\_loss(x) \quad (3)$$

$$PC\_est\_a(x) = PC\_est(x + \Delta x) \quad (4)$$

The voltage estimation section 63 divides the post-correction power consumption estimate value PC_est_a by a battery current detection value IB_sns to obtain a battery voltage estimate value VB_est (refer to expression (2)). Then, by using the obtained battery voltage estimate value VB_est, abnormality determination for the battery voltage sensor 35 is performed.

Note that, in the present embodiment, the detection values of the battery voltage sensor 35 and the battery current sensor 36 are directly obtained by the PM-ECU 60 without through the battery control ECU 53. That is, it is assumed that there is no communication delays in the battery voltage detection value VB_sns and the battery current detection value IB_sns.

FIGS. 5A to 5E show timing diagrams illustrating delay correction. In FIGS. 5A to 5E, the horizontal axis is a common temporal axis. FIG. 5A shows an accelerator position. FIG. 5B shows the MG rotation number. FIG. 5C shows MG torque. FIG. 5D shows air conditioner power consumption. FIG. 5E shows power consumption estimate values. Similarly, FIGS. 8A to 8E described later are drawn.

As shown in FIGS. 5A to 5c, as the accelerator position increases at a constant rate, the rotation number command value N* and the torque command value trq* also increase at a constant rate. In addition, as shown in FIG. 5D, at time x20, the air conditioner electric power command value P_AC* increases stepwise.

In this case, as shown in FIG. 5E, at time x20, the power consumption estimate value PC_est increases stepwise according to the variation in the air conditioner electric power command value P_AC*. In other periods of time, the power consumption estimate value PC_est increases as the torque command value trq* and the rotation number command value N* increase.

As described above, the actual power consumption delays for the power consumption delay time Δx with respect to the power consumption estimate value PC_est calculated based on the issue of a command and the command. In the present embodiment, the post-correction power consumption estimate value PC_est_a is defined as a value obtained by correcting the power consumption estimate value PC_est depending on the power consumption delay time Δx.

Figure 6A:
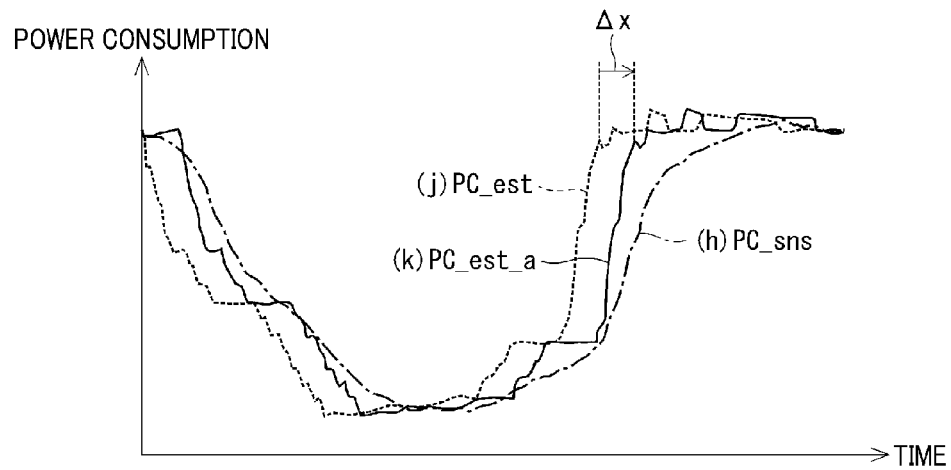
FIGS. 6A and 6B are timing diagrams illustrating post-correction power consumption estimate values and pre-correction power consumption estimate values.
Figure 6B:
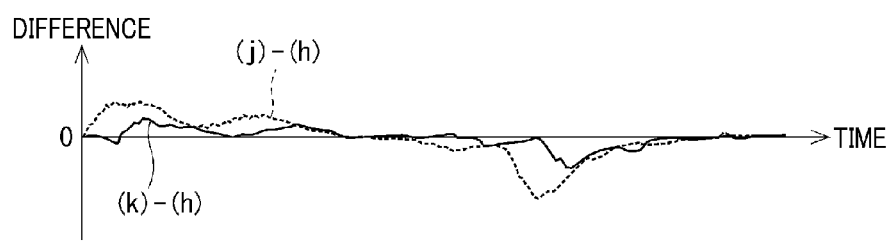

FIGS. 6A and 6B show the results of a simulation in which the vehicle 100 is made to run at a constant vehicle speed. In FIG. 6A, the solid line indicates the post-correction power consumption estimate value PC_est_a, the broken line indicates the pre-correction power consumption estimate value PC_est, the alternate long and short dash line indicates a power consumption detection value PC_sns. The power consumption detection value PC_sns is expressed by expression (5).

$$PC\_sns = VB\_sns \times IB\_sns \quad (5)$$

In addition, in FIG. 6B, the solid line indicates the difference between the post-correction power consumption estimate value PC_est_a and the power consumption detection value PC_sns, the broken line indicates the difference between the pre-correction power consumption estimate value PC_est and the power consumption detection value PC_sns. In FIG. 6B, for the sake of convenience, the post-correction power consumption estimate value PC_est_a is indicated by (k), the pre-correction power consumption estimate value PC_est is indicated by (j), and the power consumption detection value PC_sns is indicated by (h).

As shown in FIG. 6B, the difference between the post-correction power consumption estimate value PC_est_a and the power consumption detection value PC_sns ((k)−(h)) is smaller than the difference between pre-correction power consumption estimate value PC_est and the power consumption detection value PC_sns ((i)−(h)). That is, correcting the communication delay can increase the accuracy in estimating power consumption and also increase the accuracy in estimating the battery voltage VB. Hence, the accuracy in detecting abnormality of the battery voltage sensor 35 can be increased.

In the present embodiment, a post-correction battery voltage estimate value VB_est_a, which is a battery voltage estimate value used for abnormality determination, is a value corrected depending on the communication delay with respect to the MG-ECU 51 controlling the traction unit motor 10, which uses electric power of the battery 30, or to the air conditioner ECU 52 controlling the air conditioner 41.

Specifically, the voltage estimation section 63 corrects the calculated battery voltage estimate value VB_est depending on the communication delay. The abnormality determination section 65 performs abnormality determination for the battery voltage sensor 35 by using the post-correction battery voltage estimate value VB_est_a.

Hence, considering the communication delay can increase the accuracy in estimating the battery voltage VB. In addition, correcting the communication delay of the calculated battery voltage estimate value VB_est by one operation can increase the accuracy in estimating the battery voltage VB while suppressing the increase in a processing load. Thereby, the accuracy in detecting an abnormality of the battery voltage sensor 35 can be increased.

In addition, the present embodiment provides the same advantageous effects as those of the first embodiment.

Third Embodiment

The third embodiment will be described with reference to FIG. 7 and FIG. 8.

In the second embodiment, delay correction is performed for the calculated power consumption estimate value PC_est. However, in the present embodiment, delay correction is performed for each parameter used for calculating the power consumption estimate value PC_est.

As shown in FIG. 7, in the abnormality determination process of the present embodiment, if positive determination is made in S104 of FIG. 2, S114 is performed before S105. In addition, in the present embodiment, past parameters subject to delay correction (past values) during at least a time period corresponding to communication delay are held in a storage unit, not shown. Other configurations are similar to those of the first embodiment.

In S114, the abnormality determination section 65 performs delay correction of each parameter used for calculating the battery voltage estimate value VB_est. In the present embodiment, delay corrections is performed for the torque command value trq*, the rotation number command value N*, and the air conditioner electric power command value P_AC*.

As shown in FIGS. 8A to 8E, past values corresponding to the MG delay time Δx1 are defined as a post-correction torque command value trq*_a and a post-correction rotation number command value N*_a. In addition, a past value corresponding to air conditioner delay time Δx2 is defined as a post-correction air conditioner electric power command value P_AC*_a.

The post-correction rotation number command value N*_a, the post-correction torque command value trq*_a, and the post-correction air conditioner electric power command value P_AC*_a are expressed by expressions (6), (7), and (8).

$$N^*\_a(x) = N^*(x+\Delta x1) \quad (6)$$

$$trq\_a(x) = trq^*(x+\Delta x1) \quad (7)$$

$$P\_AC^*\_a(x) = P\_AC^*(x+\Delta x2) \quad (8)$$

The MG delay time Δx1 is a value corresponding to communication delay between the PM-ECU 60 and the MG-ECU 51. In addition, the air conditioner delay time Δx2 is a value corresponding to communication delay between the PM-ECU 60 and the air conditioner ECU 52.

The MG delay time Δx1 and the air conditioner delay time Δx2 are set to the order of about, for example, 10 [ms] depending on respective communication periods thereof, and are set longer than the control period (e.g. several μs) of the traction unit motor 10. Note that the MG delay time Δx1 and the air conditioner delay time Δx2 may be different from each other or may be the same. In addition, although the MG delay time Δx1 and the air conditioner delay time Δx2 are predetermined values in the present embodiment, the MG delay time Δx1 and the air conditioner delay time Δx2 may be variable.

The voltage estimation section 63 uses the post-correction rotation number command value N*_a, the post-correction torque command value trq*_a, and the post-correction air conditioner electric power command value P_AC*_a to calculate the power consumption estimate value PC_est. That is, the torque command value trq* and the rotation number command value N* of expression (1) may be replaced with the post-correction torque command value trq*_a and the post-correction rotation number command value N*_a. In addition, the post-correction air conditioner electric power command value P_AC* a is used for calculating the auxiliary unit power consumption P_acc.

In addition, in the present embodiment, power loss P_loss is set by a map operation using the post-correction rotation number command value N*_a and the post-correction torque command value trq*_a as arguments. The power loss P_loss can be also interpreted to be corrected on the communication delay by being calculated based on the post-correction rotation number command value N*_a and the post-correction torque command value trq*_a.

Figure 8A:
FIGS. 8A to 8E are timing diagrams illustrating delay correction according to the third embodiment.
Figure 8B:
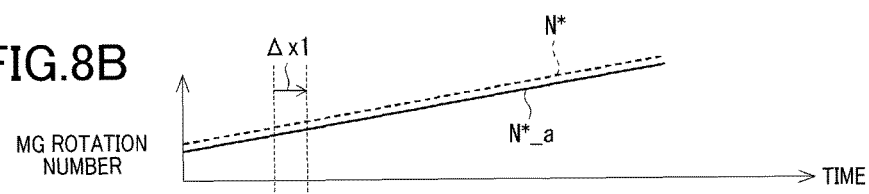
Figure 8C:
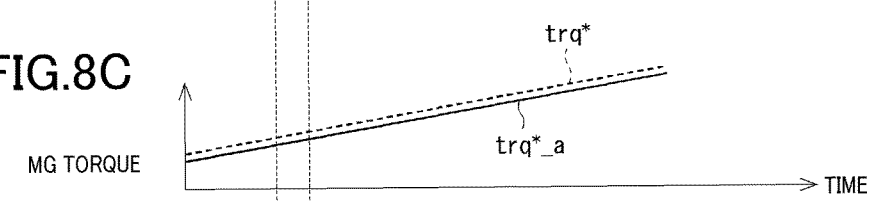
Figure 8D:
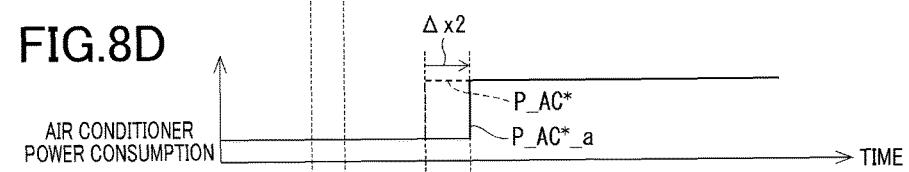
Figure 8E:
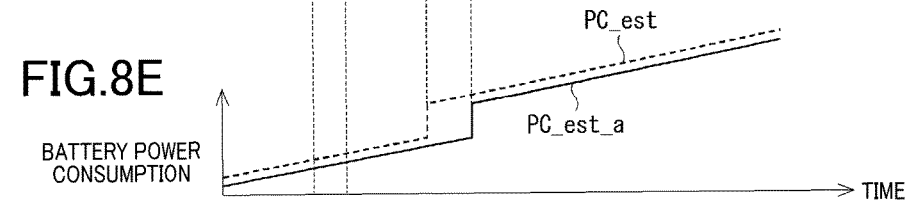

The calculated power consumption estimate value PC_est is shown in FIG. 8E.

In the present embodiment, parameters used for calculating the power consumption estimate value PC_est are corrected depending on communication delay. That is, it can be said that the battery voltage estimate value VB_est calculated based on the power consumption estimate value PC_est calculated by using the parameters considering communication delay is a value corrected depending on the communication delay.

Specifically, in the present embodiment, since the communication delay is corrected for each parameter by using the delay times Δx1 and Δx2 according to the parameter, the communication delay can be corrected with higher accuracy. Hence, since the power consumption and the battery voltage can be estimated with higher accuracy, the accuracy in detecting abnormality of the battery voltage sensor 35 can be increased.

In the present embodiment, as in the case of the second embodiment, the power-supply voltage estimate value used for abnormality determination is a value corrected depending on the communication delay with respect to the MG-ECU 51 controlling the traction unit motor 10 or the air conditioner ECU 52 controlling the air conditioner 41.

In the present embodiment, the voltage estimation section 63 corrects the parameters used for calculating the power consumption estimate value PC_est, depending on the communication delay. Note that the power consumption estimate value PC_est is used for calculating the battery voltage estimate value VB_est. The parameters used for calculating the power consumption estimate value PC_est are included in a concept of parameters used for calculating a power-supply voltage estimate value.

Thus, considering the communication delay can increase the accuracy in estimating the battery voltage VB. In addition, since the communication delay can be corrected for each parameter, the accuracy in estimating the battery voltage VB can be further increased. Thereby, the accuracy in detecting abnormality of the battery voltage sensor 35 can be increased.

In addition, the present embodiment provides the same advantageous effects as those of the first and second embodiments.

In the second embodiment and the third embodiment, the traction unit motor 10 and the air conditioner 41 correspond to units using electric power of a power supply. The MG-ECU 51 and the air conditioner ECU 52 correspond to control units controlling the unit using electric power of a power supply.

Other Embodiments (A) Voltage Estimation Section

In the above embodiments, the auxiliary unit is the air conditioner and the auxiliary battery, and the auxiliary unit power consumption is calculated based on the air conditioner power consumption and the DCDC power consumption. In other embodiments, the auxiliary unit power consumption may include power consumption of another auxiliary unit such as an electric power steering unit.

In the above embodiments, the MG power consumption is calculated by using a torque command value and a rotation number command value. In other embodiments, the MG power consumption may be calculated by using not only command values but also a torque detection value and a rotation number detection value calculated from detection values of the current sensors and the rotation angle sensor. Similarly, the auxiliary unit power consumption is calculated. In addition, when the delay correction is performed, it is desirable that a correction value is appropriately set depending on the value used for voltage estimation so that timings of the parameters of expressions (1) and (2) match each other.

In the third embodiment, communication delay is corrected for power consumption of a traction unit motor and auxiliary unit power consumption. In other embodiments, one of the corrections of the communication delay of the power consumption of the traction unit motor and the auxiliary unit power consumption may be omitted. In addition, when the auxiliary unit power consumption is based on a plurality of auxiliary units (e.g. the air conditioner, the DCDC converter, and the electric power steering unit), the delay correction may be performed for the power consumption of the auxiliary units individually, or the delay correction of part of the power consumption may be omitted. In addition, the delay correction may be performed for the auxiliary unit power consumption by one operation.

In addition, in the third embodiment, the delay correction is not performed for the power-supply current detection value. In other embodiments, the delay correction may be performed for the power-supply current detection value so that the timing thereof matches those of other parameters. In this case, it is desirable to correct the power-supply voltage detection value to be compared so that the timing thereof matches those of other parameters.

(B) Abnormality Determination Section

In the above embodiments, abnormality determination for the power-supply voltage sensor is performed, when the traction unit motor is in a stable drive state, and the battery current detection value is larger than the current determination threshold value. In other embodiments, S103 may be omitted to omit the determination of the stable drive state of the traction unit motor. In addition, in other embodiments, S104 may be omitted to omit the determination regarding the battery current detection value.

(C) Abnormality Diagnosis Apparatus

In the above embodiment, the PM-ECU corresponds to an abnormality diagnosis apparatus. In other embodiments, part of or the whole of the power consumption estimation section, the power-supply voltage estimation section, and the abnormality determination section may be configured by an ECU other than the PM-ECU.

(D) Vehicle Control System

In the above embodiments, the vehicle control system includes an engine and one traction unit motor as driving sources of the vehicle. In other embodiments, a plurality of traction unit motors may be used. For example, when two traction unit motors are used, as a so-called series-parallel system, one of the traction unit motors may be mainly used as a generator, and the other of the traction unit motors may be mainly used as a motor. The traction unit motors are not limited to be arranged in the series-parallel system, but may be arranged in any system such as a so-called series system and a so-called parallel system. When a plurality of traction unit motors are used, power consumption of the traction unit motors may be obtained by calculating power consumption for each of the traction unit motors based on torque and the rotation number and summing the results. Note that if the power consumption is a negative value, the traction unit motor is in a state of power generation by regeneration. However, the electric power generated by regeneration of the traction unit motor is also included in a concept of power consumption in a broad sense.

In addition, in other embodiments, the engine serving as a driving source of the vehicle may be omitted, and the vehicle may be a so-called EV vehicle. The vehicle may be an FC vehicle using a fuel cell as a driving source.

In addition, in other embodiments, a boosting system may be provided between the power supply and the inverter.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

The abnormality diagnosis apparatus includes a power consumption estimation section (63), a power-supply voltage estimation section (63), and an abnormality determination section (65). The power consumption estimation section estimates power consumption of a traction unit motor (10) and power consumption of an auxiliary unit (41, 42) using electric power of an electric power supply (30) to calculate a power consumption estimate value. The auxiliary unit (41, 42) is a driving source of a vehicle (100) and is driven by electric power supplied from the electric power supply.

The power-supply voltage estimation section calculates a power-supply voltage estimate value, which is an estimate value of voltage of the electric power supply, based on the power consumption estimate value and a power-supply current detection value, which is a value based on a detection value of a power-supply current sensor (36) detecting a current of the electric power supply.

The abnormality determination section determines an abnormality of a power-supply voltage sensor (35) detecting a voltage of the electric power supply, based on a comparison result between the power-supply voltage estimate value and a power-supply voltage detection value, which is a value based on a detection value of the power-supply voltage sensor.

According to the embodiments, abnormality of the battery voltage sensor can be appropriately determined by calculating the power-supply voltage estimate value and directly comparing the power-supply voltage estimate value with the power-supply voltage detection value.

What is claimed is:

1. An abnormality diagnosis apparatus comprising:
    a power consumption estimation section that estimates power consumption of a traction unit motor, which is a driving source of a vehicle and is driven by electric power supplied from an electric power supply, and power consumption of an auxiliary unit using the electric power of the electric power supply to calculate a power consumption estimate value;
    a power-supply voltage estimation section that calculates a power-supply voltage estimate value, which is an estimate value of voltage of the electric power supply, based on the power consumption estimate value and a power-supply current detection value, which is a value based on a detection value of a power-supply current sensor detecting a current of the electric power supply; and
    an abnormality determination section that determines an abnormality of a power-supply voltage sensor detecting a voltage of the electric power supply, based on a comparison result between the power-supply voltage estimate value and a power-supply voltage detection value, which is a value based on a detection value of the power-supply voltage sensor.

2. The abnormality diagnosis apparatus according to claim 1, wherein
    the power-supply voltage estimate value is a value corrected depending on a communication delay with respect to a control unit.

3. The abnormality diagnosis apparatus according to claim 2, wherein
    the power consumption estimation section corrects a parameter used in calculating the power consumption estimate value, depending on the communication delay.

4. The abnormality diagnosis apparatus according to claim 2, wherein
    the power-supply voltage estimation section corrects the calculated power-supply voltage estimate value depending on the communication delay.

5. The abnormality diagnosis apparatus according to claim 1, wherein
    when the traction unit motor is in a stable drive state, the abnormality determination section determines an abnormality of the power-supply voltage sensor.

* * * * *